United States Patent [19]
Snyder et al.

[11] Patent Number: 5,963,577
[45] Date of Patent: Oct. 5, 1999

[54] MULTIPLE ELEMENT LASER DIODE ASSEMBLY INCORPORATING A CYLINDRICAL MICROLENS

[75] Inventors: James J. Snyder, Soquel; Wai-Hon Lee, Cupertino, both of Calif.

[73] Assignee: Blue Sky Research, San Jose, Calif.

[21] Appl. No.: 08/837,002

[22] Filed: Apr. 11, 1997

[51] Int. Cl.⁶ .................................................. G02B 13/08
[52] U.S. Cl. .......................... 372/101; 372/75; 363/112; 359/668
[58] Field of Search ................................ 372/101, 75, 29, 372/20, 22, 32; 363/112; 359/668

[56] References Cited

U.S. PATENT DOCUMENTS

| | | | |
|---|---|---|---|
| 4,734,906 | 3/1988 | Baer et al. | 363/112 |
| 5,432,610 | 7/1995 | King et al. | 372/75 |
| 5,555,253 | 9/1996 | Dixon | 372/29 |
| 5,636,059 | 6/1997 | Snyder | 359/668 |

*Primary Examiner*—Rodney Bovernick
*Assistant Examiner*—Yisun Song
*Attorney, Agent, or Firm*—LaRiviere, Grubman & Payne LLP

[57] ABSTRACT

Multiple element laser diode assembly incorporating a cylindrical microlens and at least one of an astigmatism correcting element and a collimating element. The use of a single purpose cylindrical microlens, for instance for circularizing a beam of laser light output from said diode, in operative combination with at least one additional optical element for correcting astigmatism and for collimating the beam enables the passive mounting of the several optical elements of the assembly without an active alignment step. The cylindrical microlens may incorporate as single powered surface, as may the astigmatism correction element. Alternatively, the astigmatism correction element may comprise a tilted optical plate. The collimating lens may be a spherical lens.

11 Claims, 7 Drawing Sheets

U.S. Patent
4,731,772
(Pre-Hoetron)

U.S. Patent
5,050,153
(Hoetron)

Present Invention

FIGURE 8a
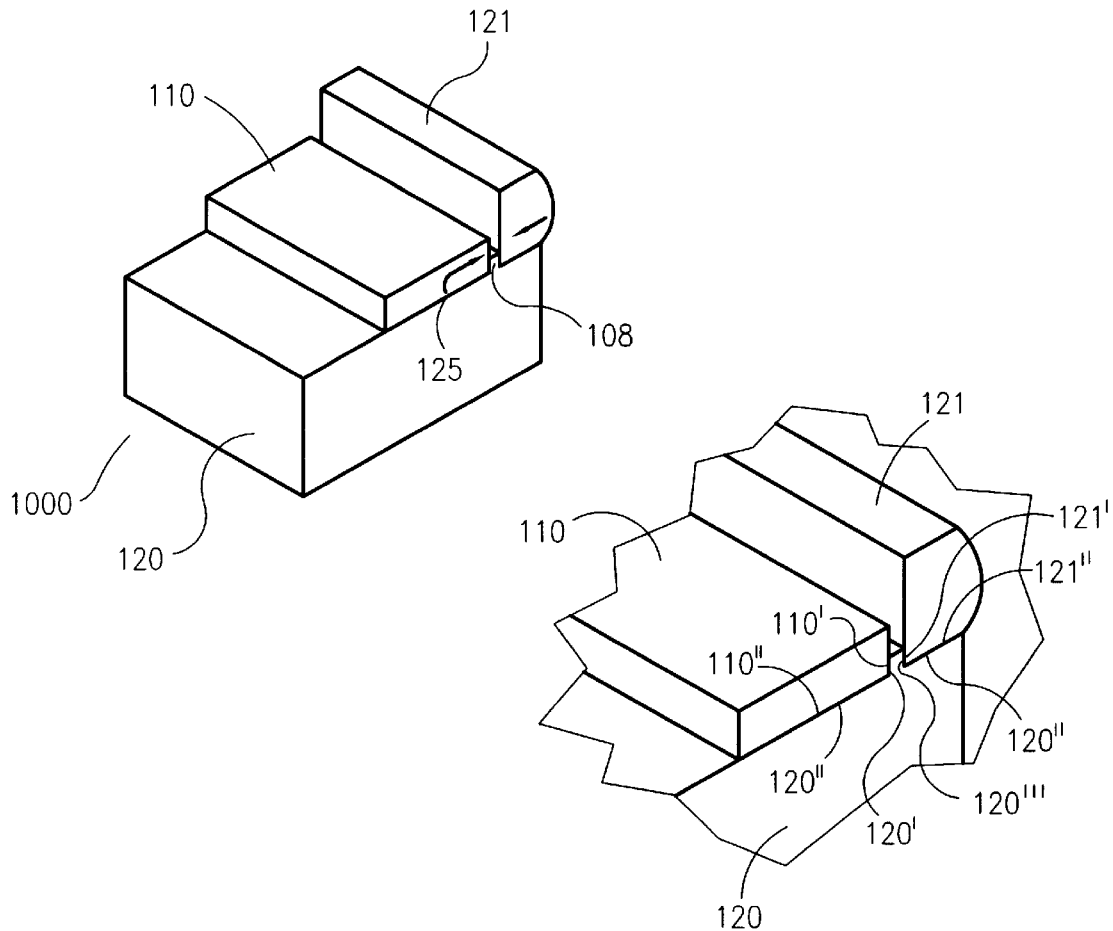
FIGURE 8b
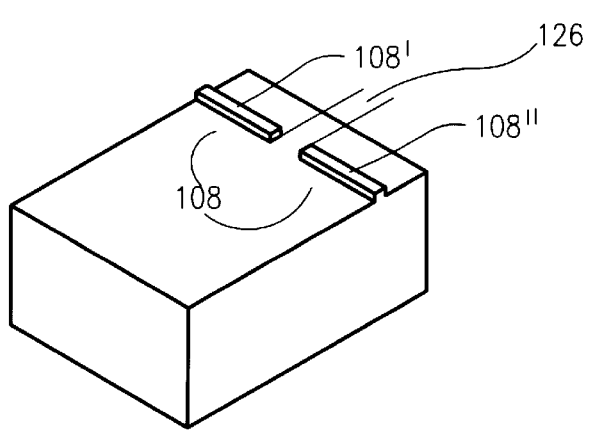
FIGURE 8c

MULTIPLE ELEMENT LASER DIODE ASSEMBLY INCORPORATING A CYLINDRICAL MICROLENS

TECHNICAL FIELD

The present invention relates to a methodology for integrally mounting optical lenses to electronic components, and to electronic components so formed with integral optical lenses. More specifically, the present invention teaches a methodology particularly suited for the mounting of microoptical lenses to laser diodes during the process of manufacturing the diodes, resulting in increased accuracy of lens placement, which methodology requires fewer manufacturing steps to implement than prior mounting methods. The methodology taught herein is particularly well suited for mounting cylindrical microlenses to laser diodes, during the process of manufacturing the diodes.

BACKGROUND OF THE INVENTION

U.S. Pat. No. 5,081,639 teaches a laser diode assembly including a cylindrical lens. The assembly taught therein includes a diffraction-limited cylindrical lens having a numerical aperture greater than 0.5 which is used to collimate a beam from a semiconductor laser diode. A collimated beam is one which is neither converging nor diverging; i.e., the rays within the beam are travelling substantially parallel to one another. Semiconductor laser diodes are efficient sources of laser radiation, however the highly divergent beam emitted from a semiconductor laser diode presents problems in many applications. The divergence of the semiconductor laser diode's beam is caused by its exit aperture which is very narrow along one axis (the "fast" axis, which is defined to be perpendicular to the laser junction), and much wider along the perpendicular axis (the "slow" axis, which is defined to be parallel to the laser junction). These two axes correspond to the Y and X axes, as will be later explained. The cross section of the beam emitted along the fast, or Y, axis is highly divergent due to diffraction effects. In comparison, the wider aperture, defined along the X axis, emits a beam cross section that diverges only slightly.

Laser diodes, or more properly, semiconductor lasers, are generally constructed according to well known principles of semiconductor manufacturing technology. A discussion of these principles can be found in Richard R. Shurtz II, *Semiconductor Lasers and LEDs* in *Electronics Engineers' Handbook*, 3rd ed. (hereinafter "Shurtz") (Donald G. Fink and Donald Christiansen, eds. 1989,). In order to collimate the beam produced by a semiconductor laser diode, the invention taught in U.S. Pat. No. 5,081,639 teaches the mounting of a cylindrical lens optically aligned with the laser diode to provide a beam of collimated light from the Y axis of the diode.

U.S. Pat. No. 5,181,224 illustrates the use of cylindrical lenses to (inter alia) create a slowly diverging beam of light. This lens may be said to be "circularizing" and, when installed on any of a variety of laser diodes is available as the "CIRCULASER™" diode available from Blue Sky Research in Santa Cruz, Calif.

While the above-described laser diode assemblies are fully effective for their intended use, the method of manufacture has heretofore resulted in manufacturing inefficiencies. In any optical system, the alignment of the various optical elements is critical to the functioning of the system. This is certainly the case where a cylindrical microlens is incorporated into an optical system with a semiconductor laser diode to provide a low-cost source of collimated light.

As is typical of many optical applications, there are six degrees of freedom inherent in the positioning of the lens with respect to the semiconductor laser diode, as shown in FIG. 1. Having reference to that figure, a cylindrical microlens, 100 is shown. The lens has three axes, X, Y and Z. The Z axis, 1, corresponds to the optical axis of the optical system. The X, 3, axis is transverse to the Z axis, 1, in the horizontal plane. The Y, 2, axis is also perpendicular to the Z axis but in the vertical direction.

Positioning the lens along the X, Y, and Z axes defines the first three degrees of freedom. Furthermore, the lens may be rotated about each of these axes as shown at 10, 20, and 30, and each of these rotations also defines a degree of freedom with regard to alignment of the lens in the optical system. For cylindrical lenses, placement of the lens along the X axis, 3, is not critical. This fact means that the alignment of a cylindrical microlens with respect to a semiconductor laser diode accurately requires alignment with five degrees of freedom.

It will be apparent to those of ordinary skill in the art that a mechanical translation stage providing the required five degrees of freedom is subject to considerable inaccuracies. These inaccuracies are the cumulative result of the tolerances required by any mechanical system for motion in essentially five directions.

To overcome this source of error, the manufacture of laser diode assemblies including microlenses has, to date, proceeded in a number of steps. First, a section of cylindrical microlens is mounted on a small mounting bracket which because of its resemblance to a football goal post is referred to as a "goal post." It is intended that rotation about the X and Y axes is defined by the lens' position on the goal post. After the lens is mounted on the goal post, the goal post/lens assembly is then optically positioned along the Y and Z axes, and the lens affixed to the semiconductor laser diode. In order to perform these several alignments, a laser diode, usually the diode to which the lens will ultimately be assembled, is energized and the diode's laser beam directed through the lens to a screen. The operator manipulates the lens along and about the several axes until the projected beam meets the required specifications for the assembly. This process is referred to hereinafter as "active alignment". In this manner, movement along the several axes, as well as rotation about those axes is manipulated by an operator who assembles each lens and laser diode. The entire operation is very dependent on the skill of the operator, as the optical cement utilized first to affix the lens to the goal post and finally to the diode introduces a variable into the problem. This variable is simply that the surface tension of the cement between the several elements on which it is used causes motion between those elements. This motion of course tends to misaligned the optical elements.

In contrast to the active alignment steps outlined above, passive alignment, as used herein, defines a process whereby the lens is aligned solely by means of mechanical jigs, fixtures, alignment blocks, and thereafter secured in position with respect to the diode. Passive alignment does not require the projection of a beam of light through the lens, nor indeed, manipulation of the lens with respect to beam alignment or performance. Passive alignment relies solely on the mechanical alignment of the lens with respect to the diode to achieve the required optical alignment.

The discussion on fabrication is directed to the fabrication of electro-optical devices in general, and of semiconductor lasers having in operative combination therewith at least one lens for modifying the output beam of a semiconductor laser diode. One such device of an early type is taught in U.S. Pat. No. 4,731,772, as referenced in U.S. Pat. No. 5,050,153 and this device is shown in FIGS. 2a and 2b.

Referring to FIG. 2a, the laser optical system taught by the '772 reference is shown, along with a depiction of the slow axis of the laser beam. The '772 system comprises a semiconductor laser, for instance a semiconductor laser diode 110, having in operative combination therewith a collimating lens 1102 for collimating the beam, 1101, output from laser diode 110. Further in operative combination with diode 110 and collimating lens 1101, is an astigmatism-correcting cylindrical lens 1103.

Referring now to FIG. 2b, an orthogonal view to that of FIG. 2a is shown, presenting the fast axis of output beam 1101. As shown therein, beam 1101 is not circular, but rather has a higher degree of divergence in the fast axis. Accordingly, the system according to the '772 patent is shown to be inefficient in collecting the light collected by the laser diode.

U.S. Pat. No. 5,050,153 teaches a similar device, implemented as a semiconductor laser optical head assembly, and utilizing a tilted plate for astigmatism correction in place of the cylindrical lens taught in the '772 reference. This system is shown in FIGS. 3a and 3b. Having reference to the former figure, the diode/lens assembly is shown, presenting the slow axis of the output beam, 1101. In addition to providing other functions, optical plate 1104 provides the astigmatism correction provided by a separate lens in the '772 teaching.

Referring now to FIG. 3b, the fast axis of the output beam 1101 is again shown. Again, the fast axis is more widely divergent than the slow axis, leading to loss of optical efficiency.

To overcome the loss of optical efficiencies inherent in each of these designs, U.S. Pat. No. 5,181,224 utilizes a cylindrical microlens which with one optical element circularizes and corrects the astigmatism in the output beam of a semiconductor laser diode. To obtain these advantages, the cylindrical lenses must be aligned to tolerances within 1–2 $\mu$m along at least two axes. This precision alignment requires the active alignment of the lens with the diode. The resultant apparatus, e.g., the previously discussed CIRCULASER™, is a low-divergence, high numerical aperture, highly efficient semiconductor laser diode assembly, with properties unmatched by other laser diodes.

Indeed, the advantages accruing to the CIRCULASER™ are only obtainable by the use of microlenses. In optical systems of the type described in U.S. Pat. No. 5,080,706, reducing the size of the optical elements thereof is generally regarded as having positive advantages in lens fabrication and accuracy. Indeed, the performance provided by the use of microlenses, i.e. lenses not substantially larger than about 1000 $\mu$m in diameter, is not attainable using macroscopic lenses.

The process whereby this apparatus is manufactured requires considerable effort on the part of skilled technicians and is a source of higher manufacturing cost or increase in manufacturing time. The apparatus taught in the '224 reference is embodied in accordance with the generally accepted principle of optical design that an optical system having fewer lens elements is both more optically efficient in collecting light emitted by the laser diode, and requires fewer alignment steps to manufacture.

The remaining problem however, is that the current manufacturing process for semiconductor laser diode assemblies including a cylindrical microlens is a labor intensive process, requiring considerable effort on the part of skilled technicians to effect the assembly of one lens to one diode.

What is needed is a methodology which will result in further substantial savings in skilled manpower currently required to accurately assemble a cylindrical microlens with a laser diode, especially a single-mode laser diode.

DISCLOSURE OF INVENTION

As opposed to the previously discussed process whereby individual microlenses are actively aligned and mounted to laser diodes, the principles of the present invention comprehend forming a multiple-element laser diode assembly including a microlens using only passive mounting techniques to effect the mounting of optical elements thereof. This new method, and an apparatus formed according to the method, present significant improvements in the technology of manufacturing CIRCULASERS™, or "virtual point source" lasers. Microlenses suitable for use in the present invention are available from Blue Sky Research in Santa Cruz, Calif.

The previous teaching of the '224 patent is the use of a microlens designed to circularize and remove astigmatism from the output beam of a laser diode. No further aberration correction is required. It is this simple, yet elegant configuration which has become the state of the art for laser diode beam correction. If, on the other hand, the microlens is used only for circularizing the beam, additional correction for astigmatism is required, which additional corrections require additional optical elements.

The addition of extra optical elements means that the overall system is both more complex, and requires alignment of the several optical elements thereof. Indeed, the use of a cylindrical microlens solely for circularizing the output beam tends to introduce astigmatism requiring astigmatism correction elsewhere. Nevertheless, a microlens (with its inherent high degree of efficiency, high numerical aperture and diffraction limited performance) used solely to circularize the output beam, in combination with additional optical elements to correct astigmatism therein presents unique and novel advantages over the prior art.

First, and most importantly, utilizing an apparatus of the type described herein, the resultant optical output is substantially equal to that of the microlens/diode taught in the '224 reference. Secondly, the steps of mounting the several optical elements of such a system can each proceed with a degree of required precision as much as one or two orders of magnitude lower than the prior art. This means that where before the degree of precision required in mounting the microlens is 1–2 $\mu$m, the composite structure taught herein presents the advantages of the prior art with a required degree of precision much as 25–50 $\mu$m. This makes possible the fabrication of the composite structure solely by passive mounting the optical elements.

U.S. Pat. No. 5,081,639 teaches a laser diode assembly including a cylindrical lens. U.S. Pat. No. 5,181,224 teaches several novel diffraction-limited microlens configurations which are especially valuable for use in conjunction with laser diodes.

U.S. Pat. Nos. 5,080,706 and 5,155,631 teach methods for fabricating cylindrical microlenses of selected shape, at least some of which microlenses may be suitable for use with laser diodes.

U.S. Pat. No. 5,050,153 teaches a semiconductor laser optical head assembly.

U.S. patent application Ser. No. 08/725,151 teaches the formation of a number of laser diode/microlens assemblies from a single alignment and subsequent separation steps.

U.S. Pat. Nos. 5,050,153, 5,080,706, 5,081,639, 5,155, 631, and 5,181,224, as well as U.S. patent application Ser. No. 08/725,151 are herewith incorporated by reference.

Other features of the present invention are disclosed or apparent in the section entitled "BEST MODE OF CARRYING OUT THE INVENTION".

BRIEF DESCRIPTION OF THE DRAWINGS

For fuller understanding of the present invention, reference is made to the accompanying drawing in the following detailed description of the Best Mode of Carrying Out the Invention. In the drawing:

FIG. 8a is a perspective view of one laser diode/lens pair mounted on a carrier and formed by utilizing the diode strip/carrier/lens assembly methodology taught herein.

FIG. 8b is an enlarged section of a portion of FIG. 8a, detailing the alignment surfaces of the several elements of an assembly according to the principles of the present invention.

FIG. 8c is a perspective view of the carrier for the diode/lens pair of FIG. 8a.

FIG. 9b is a perspective view of the carrier for the diode/lens pair of FIG. 9a.

Figure 1:
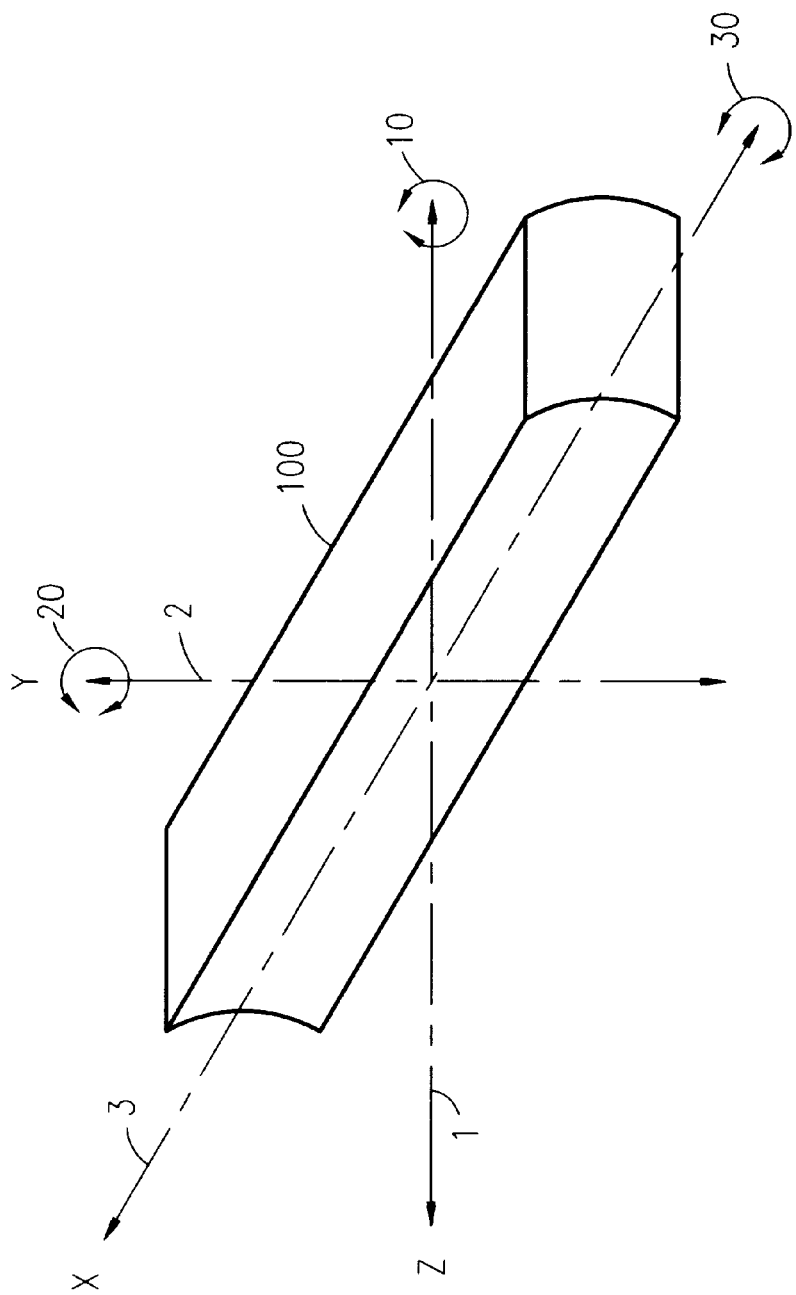
FIG. 1 is a depiction of the several axes defined by a cylindrical lens, and of the degrees of freedom inherent in these axes.
Figure 2A:
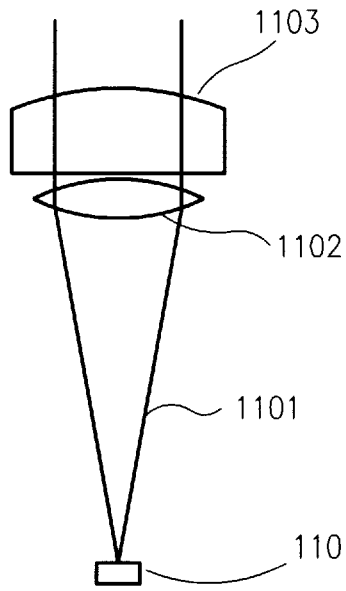
FIG. 2a is an optical schematic of a prior art semiconductor laser assembly, utilizing a cylindrical lens to correct astigmatism, showing the slow axis of the output beam thereof.
Figure 2B:
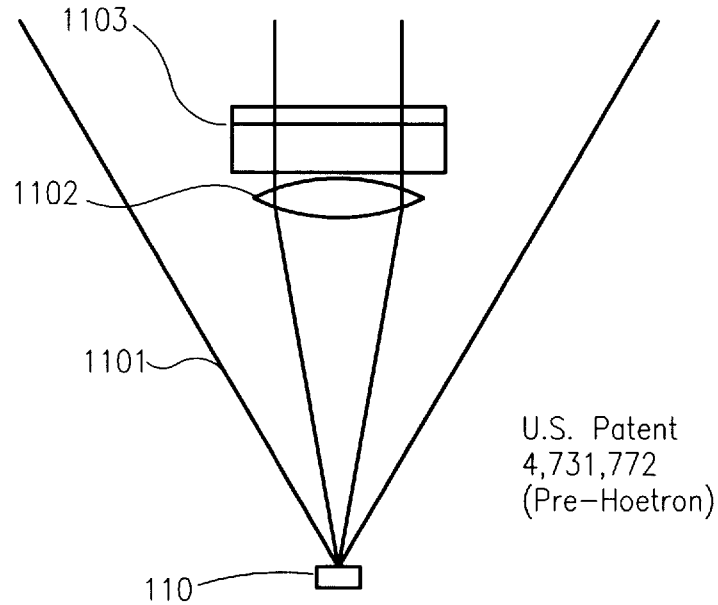
FIG. 2b is an optical schematic of a prior art semiconductor laser assembly, utilizing a cylindrical lens to correct astigmatism, showing the fast axis of the output beam thereof.
Figure 3A:
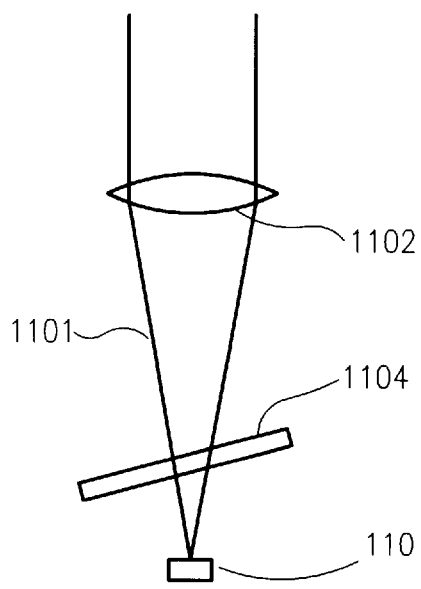
FIG. 3a is an optical schematic of a prior art semiconductor laser assembly, utilizing a tilted plate to correct astigmatism, showing the slow axis of the output beam thereof.
Figure 3B:
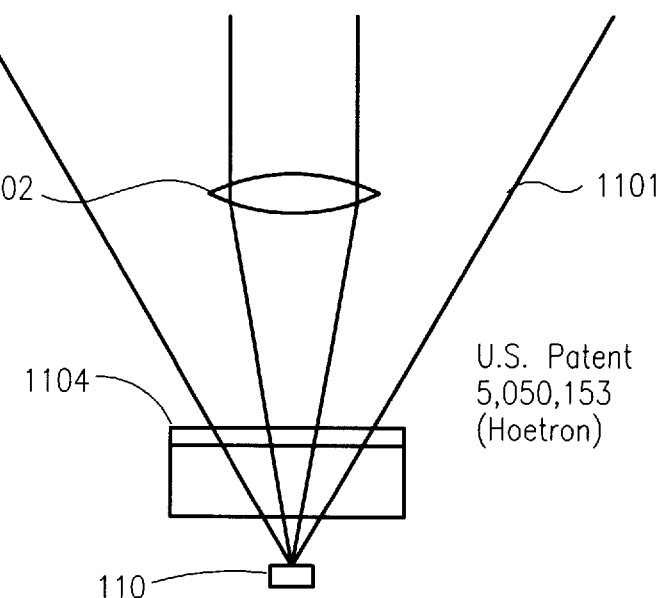
FIG. 3b is an optical schematic of a prior art semiconductor laser assembly, utilizing a tilted plate to correct astigmatism, showing the fast axis of the output beam thereof.

Reference numbers refer to the same or equivalent parts of the invention throughout the several figures of the drawing.

BEST MODE OF CARRYING OUT THE INVENTION

A length of cylindrical microlens, for instance a microlens constructed in accordance with the teachings of at least one of U.S. Pat. Nos. 5,080,706, 5,155,631, and 5,181,224, is fabricated. The length of the lens may preferably be at least equal to the diameter of the crystal wafer from which the laser diodes will be formed.

Figure 4:
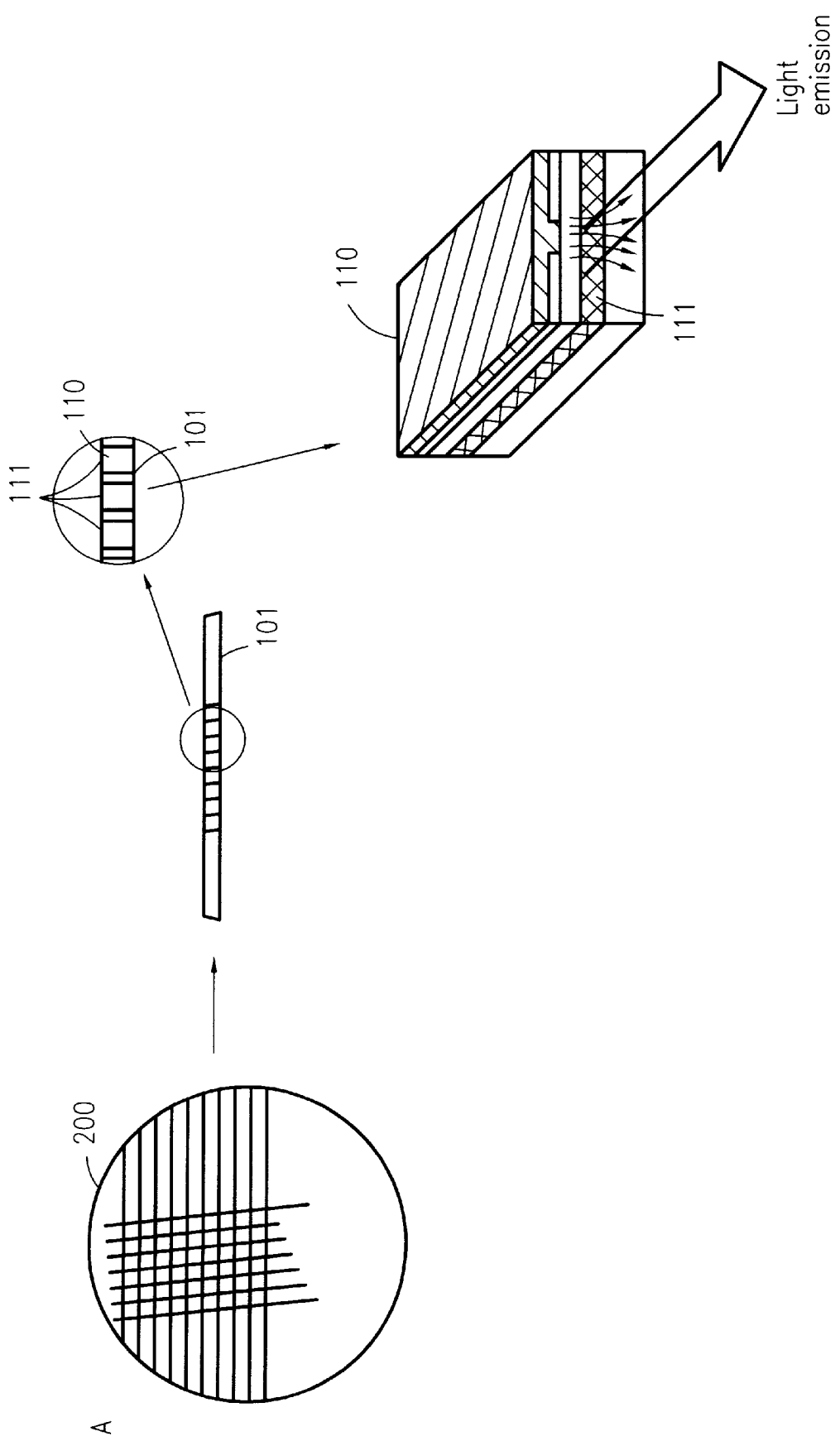
FIG. 4 is a representation of a blank semiconductor wafer.

Referring now to FIG. 4, laser diodes are formed in the conventional manner, for instance as discussed in E. A. Gerber et al., *Discrete Circuit Components*; Alan B. Grebene, et al., *Integrated Circuits and Microprocessors*; and Richard R. Shurtz II, *Semiconductor Lasers and LEDs*; all in *Electronics Engineers' Handbook*, 3rd ed. (Donald G. Fink and Donald Christiansen, eds. 1989), which is hereby incorporated by reference. Diodes 110 are formed on the surface of wafers 200. Laser diodes may be formed on gallium arsenide wafers, and the following discussion assumes the use of gallium arsenide as the substrate for diode production. It should be noted that while gallium arsenide is commonly employed to grow the crystal (not shown) from which wafers 200 are cut, the principles of the present invention specifically contemplate the use of alternate laser diode substrates, and indeed contemplate the utilization of the principles taught herein on other electronic devices, whether semiconductor or not.

Referring now to FIGS. 5a through 9b, a novel single mode laser source is disclosed. Having reference to the former figure, a semiconductor laser, for instance a single-mode laser diode 110, has mounted in operative and optical combination therewith a cylindrical microlens 121. Microlens 121 is configured to circularize output beam 1101, shown here in the slow axis.

In one preferred embodiment of the present invention, microlens 121 is a plano-convex cylinder, with dimensions of about 0.150 mm in axial thickness (i.e., along the optical axis) by 0.200 mm in width (i.e., perpendicular to the optical axis). The distance from the emitter face 111 of laser diode 110 to planar surface 122 of diode 110 is 0.025 mm. The convex, or powered, surface, 123, of microlens 121 is described by the standard "sag" equation:

$$z = \frac{cy^2}{1 + \sqrt{1 - (1+k)c^2 y^2}} + a_2 y^2 + a_4 y^4 + \ldots$$

which defines the distance, z, from a reference plane normal to an axis (in this case the optical axis) as a function of y. The reference plane touches the convex surface at its vertex. There is no sag equation as a function of x, because in the preferred embodiment microlens 121 is a cylindrical lens. In the equation, c is the curvature of the surface, k is the conic constant, and the $a_n$ are the coefficients of the higher order terms. In the preferred embodiment c=−10.972; k=−.3543195; and $a_4$=−17.06171. The other coefficients an are all zero.

Figure 5A:
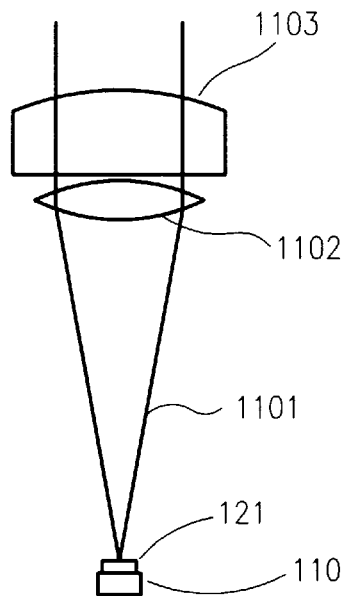
FIG. 5a is an optical schematic of a multiple-element semiconductor laser assembly constructed according to the principles of the present invention, utilizing a cylindrical lens to correct astigmatism, showing the slow axis of the output beam thereof.
Figure 5B:
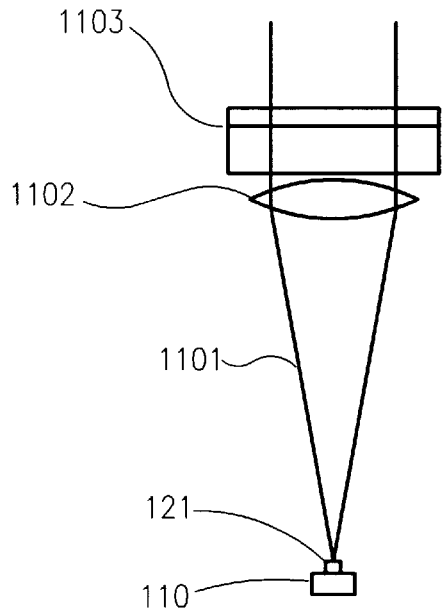
FIG. 5b is an optical schematic of a multiple-element semiconductor laser assembly constructed according to the principles of the present invention, utilizing a cylindrical lens to correct astigmatism, showing the fast axis of the output beam thereof.

Microlens 121 may have no astigmatism correcting function: in fact, it may actually increase the astigmatism of the beam. After beam 1101 is circularized by microlens 121, it is collimated, in this embodiment by collimating lens 1102, which lens has a focal length of 11 mm. Subsequently, the astigmatism of beam 1101 is corrected by an astigmatism correcting lens 1103, for instance a cylindrical lens with a focal length of 280 mm, having one powered convex surface as shown. FIG. 5*b* shows the same apparatus, in the orthogonal view, detailing the effects of the circularizing microlens 121, and the attendant reduction of the divergence, along the fast axis of the beam.

On the surface, this invention appears to contradict the general principles of optical design, but it presents advantages hitherto not contemplated in the art: among others, it is fault-tolerant to a degree hitherto unattainable in similar devices. Indeed, the apparatus shown herein may be formed by the simple mechanical mounting of the several elements thereof, without requiring any further precision alignment of any of the elements. In most optical systems, additional elements increase the complexity of the alignment problem. In this invention, alignment is actually easier, even though there are more elements. This is true because the additional element, in this case the 280 mm focal length cylindrical lens, is relatively insensitive to alignment. This fact, in combination with the relative insensitivity to alignment of the microlens with respect to the diode enables a precise optical device capable of being manufactured without active alignment, or indeed without any particularly precise alignment whatsoever.

Figure 6A:
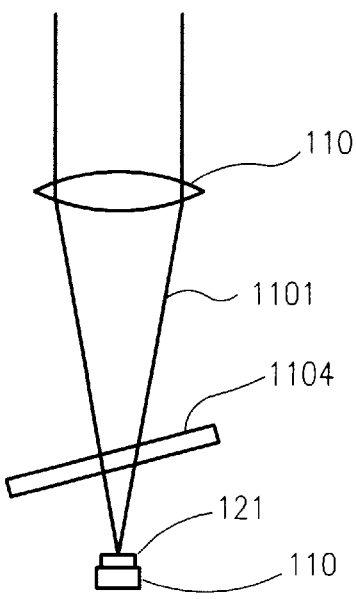
FIG. 6a is an optical schematic of a multiple-element semiconductor laser assembly constructed according to the principles of the present invention, utilizing a tilted holographic lens assembly to correct astigmatism, showing the slow axis of the output beam thereof.
Figure 6B:
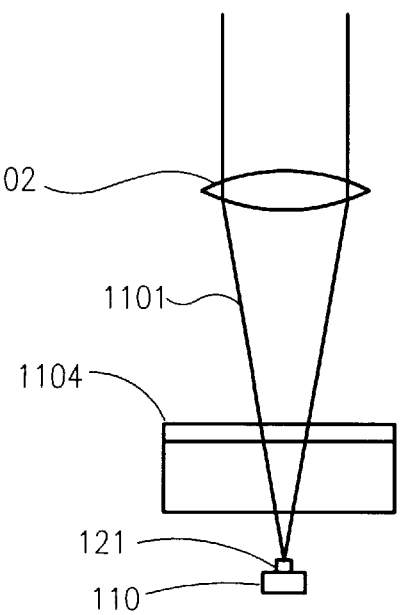
FIG. 6b is an optical schematic of a multiple-element semiconductor laser assembly constructed according to the principles of the present invention, utilizing a tilted holographic lens assembly to correct astigmatism, showing the fast axis of the output beam thereof.

An alternative embodiment of this invention is shown in FIGS. 6*a* and 6*b*. This embodiment utilizes the tilted optical plate, 1104, of the '153 reference to achieve astigmatism correction. As shown in FIG. 6*a*, optical plate 1104 is mounted in the optical beam 1101 subsequent to that beam having been circularized by microlens 121. Subsequent to the astigmatism correction performed by tilted plate 1104, beam 1101 is collimated by lens 1102. Again the orthogonal view is shown in FIG. 6*b*, and shows the circularizing effects of microlens 121. Note that the fast axis divergence has been reduced by microlens 1102.

Figure 7:
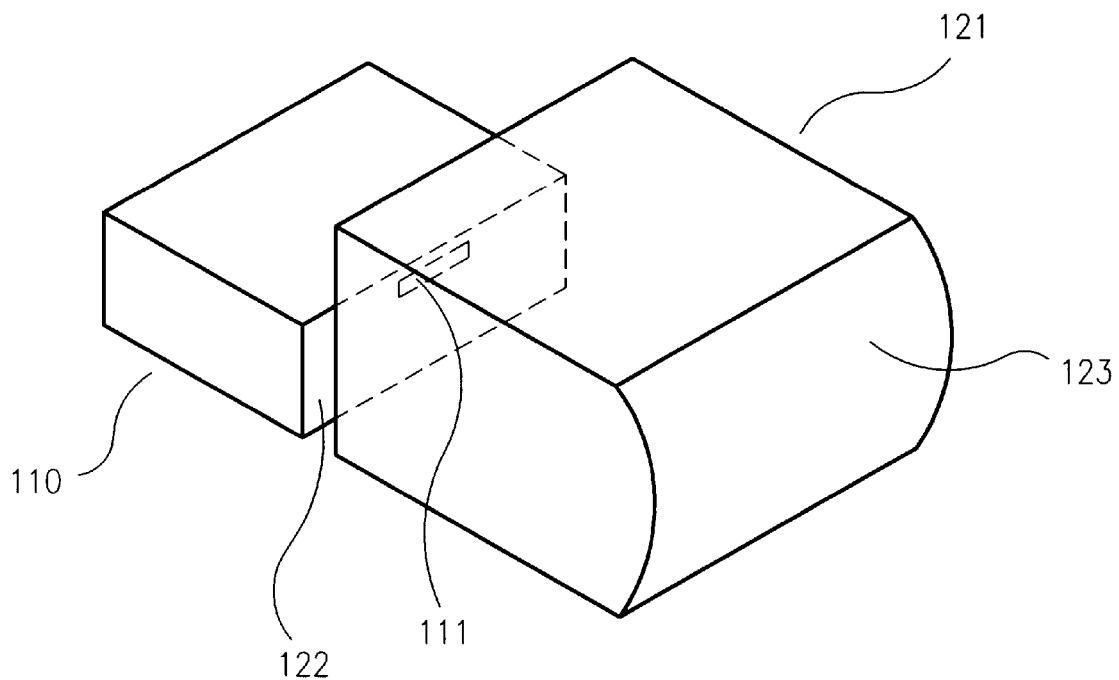
FIG. 7 is a perspective view of one laser diode—lens pair according to a preferred embodiment of the present invention, showing the position of the lens with respect to the emitter face of the diode.

Referring to FIG. 7, the relationship of microlens 121 to diode 110 is shown. The optical axis (not shown) of microlens 121 is substantially aligned with the emitter face 111 of diode 110. As previously discussed, this alignment is preferably performed passively, although active alignment may be utilized where required by the application. Passive mounting, in this preferred embodiment, is performed by means of an accurately formed carrier, not shown in this view.

Having continued reference to FIG. 7, in this preferred embodiment, the heights of microlens 121 and diode 110 are selected as follows: the height of microlens 121 is twice the height of diode 110 so that when microlens 121 and diode 110 are mounted on a carrier having a planar surface, emitter face, or aperture, 111 is aligned with the optical axis (not shown) of microlens 121. Alternatively, where such height selection is either undesirable or unattainable, a carrier having a first and second planar surfaces, which first and second surfaces are of differing altitudes (i.e., parallel but not coplanar) may be utilized to bring emitter face 111 into substantial optical alignment with the optical axis of microlens 121.

At FIGS. 8*a* and 8*b* a diode/lens/carrier assembly 1000 is shown, constructed in accordance with the principles of the present invention by mounting microlens 121 and diode 110 on carrier 120. Carrier 120, in the embodiment of the present invention shown in this figure, is an accurately formed mounting device which aligns diode 110 and microlens 121, and includes an accurately formed ridge, or spacer 108. Carrier 120 receives thereon, by simple passive mounting, diode 110 and microlens 121.

Diode 110 and microlens are aligned, and retained in alignment by carrier 120 as follows: Diode 110 is positioned, at surfaces 110' and 110", in intimate contact with surfaces 120' and 120", respectively, of carrier 120. In similar fashion, microlens 121 is positioned, at surfaces 121' and 121", in intimate contact with surfaces 120" and 120''' of carrier 120. Positioning of lens 121 and diode 110 with respect to carrier 120, as previously discussed, is accomplished by simple mechanical alignment, utilizing jigs, fixtures, robotic assembly devices, or other mechanical alignment technologies well known to those having ordinary skill in the art. Diode 110 and microlens 121 are then attached to carrier 120 in any of the manners hereafter discussed, or in the alternative, in any manner known to those having ordinary skill in the art.

Referring now to FIG. 8*c*, spacer elements 108' and 108" in combination with surfaces 120', 120", and 120''' serve to maintain the proper working distance between diode 110 and microlens 121. Further, this combination serves maintain the proper alignment along and about the z and y axes, as well as about the x axis. (Axes not shown in this view.) In, this embodiment, spacer 108 is a discontinuous spacer, comprised of spacer elements 108' and 108". Spacer elements 108' and 108" define therebetween gap 126. The output beam (not shown) from diode 110 may travel through gap 126 where the height of the emitter face (not shown) with respect to the height of spacer 108 requires it. In the alternative, spacer 108 may, of course, be implemented as a solid entity.

Carrier 120 may be fabricated as utilizing any of several integrated circuit manufacturing technologies. Further, one manufacturer of optical circuits which may be implementable in the present invention is Photonic Integration Research Inc. (PIRI), 2727 Scioto Parkway, Columbus, Ohio 43221-4658. Alternatively, carrier 120 may be fabricated, or built up, according to any of the several carrier/spacer configurations detailed in U.S. patent application Ser. No. 08/725,151, or other integrated circuit manufacturing methodologies known to those having ordinary skill in the art.

Figure 9A:
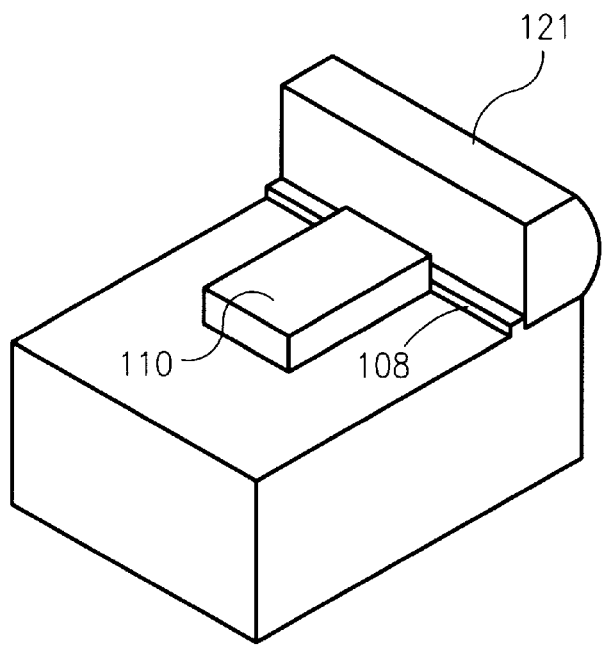
FIG. 9a is a perspective view of one laser diode/lens pair formed by the mounting of an individual diode and an individual lens on a carrier, in accordance with a second preferred embodiment taught herein.
Figure 9B:
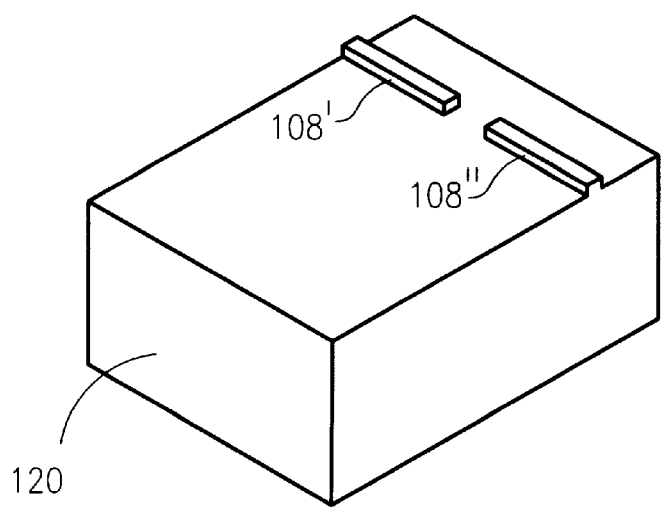

The preferred embodiment of the present invention illustrated in FIGS. 8*a*–8*c* details an exemplar utilizing some of the principles of diode/lens assembly technology further detailed in U.S. patent application Ser. No. 08/725,151. This technology enables the formation of a number of laser diode/lens/carrier assemblies from a single alignment procedure. Those principles may be employed, in combination with those of the present invention to produce the apparatus disclosed and taught herein. In the alternative, some applications of the principles of the present invention may require the manufacture of individual lens/diode/carrier combination. Such a "one-off" embodiment is shown in FIGS. 9*a* and 9*b*.

While the principles of the present invention contemplate the formation of multiple lens/diode/carrier assemblies by means of the use of diode strips, carrier strips, and lengths of microlens as discussed in U.S. patent application Ser. No. 08/725,151, it will be immediately apparent to those having ordinary skill in the art, upon study of the principles presented herein, that the multiple element laser diode assembly taught herein may, with equal facility, be fabricated individually. The plan view of an exemplar individually fabricated assembly 1001 is shown in FIGS. 9*a* and 9*b*. Having reference to those figures, a carrier, 120 is shown, having a microlens 121 and a laser diode, 110, mounted thereon, thereby forming a second assembly 1001. This embodiment is substantially identical to that previously discussed and shown in FIGS. 8a–8c, with the exception of scale. Where assembly 1001 implements an individually assembled unit, carrier 120 may optionally be formed to larger extent than the previous exemplar to assist in holding and jigging the carrier. This is of course an option, and where suitable micromanipulation is utilized, for instance, may not be required.

The order of assembly is highly application dependent. In a first preferred embodiment of the present invention, diode 110 and microlens 121 are assembled to carrier 120 by means of solder. This soldering is accomplished as follows: a film of metal is deposited by plating at least a portion of diode 110; a further portion of microlens 121, and carrier 120. In this embodiment, a thin ($\leq 10$ $\mu$m) film of gold is utilized, but other metals and alternative thicknesses may, with equal facility, be employed. For each of the previously discussed plating steps, masks may be used to limit the plating of a given element to only those surfaces which are desirous of plating.

After the plating is accomplished, and the components aligned utilizing the passive techniques previously discussed, a thin coating, this time of indium solder, is deposited on the plated surfaces by means of vapor-phase deposition. Alternative deposition methodologies, for either or both of the aforementioned plating and solder deposition steps include, but are not necessarily limited to vacuum evaporation, cathode sputtering, anodization; and other metallic deposition methodologies well known to those of ordinary skill in the art.

Alternative solder heating methodologies well known to those of ordinary skill in the art may, with equal facility, be utilized for either of any of the soldering steps taught herein. These methodologies include, but are not necessarily limited to: hot gas soldering, wave soldering, vapor phase reflow soldering, laser reflow soldering, hot-bar soldering, hot gas soldering, and ultrasonic soldering.

Alternatives to the previously discussed plating step, for depositing a metallic coating on the various elements are: vacuum evaporation, cathode sputtering, vapor-phase deposition, anodization, and other metallic deposition methodologies well known to those of ordinary skill in the art.

Further, the previously discussed soldering methodology may, with equal facility, be replaced in some alternative embodiments by: eutectic bonding, chemical adhesives including polymeric and monomeric isomers, thermocompression bonding, ultrasonic bonding, thermosonic bonding, spot welding, or other attachment methodologies well known to those of ordinary skill in the art.

While the preferred embodiment contemplates soldering diode 110 and lens 120 to carrier 121 in two discreet steps, in some applications it may prove advantageous to perform one soldering step wherein the several elements are soldered simultaneously. This alternative embodiment is also contemplated by the teachings of the present invention.

The previous discussion has centered on a methodology for forming a laser diode with at least an integral cylindrical microlens. It will be immediately apparent to those of ordinary skill in the art that the principles of the present invention may, with equal facility, be applied to a broad range of electro-optical implementations. The principles of the present invention specifically contemplate all such implementations.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the teachings of the present invention specifically contemplate the use of alterative: lens geometries; carrier geometries; diode geometries; carrier materials; diode materials; film deposition technologies; electronic or electro-optical devices; attachment methodologies; solder fluxes, alloys and soldering procedures; adhesives; and lens coating technologies. Furthermore, the principles of the present invention contemplate the implementation of a plurality of optical elements in operative combination with the microlens to achieve a specific optical objective. The invention disclosed herein may be practiced without any element which is not specifically disclosed herein.

What is claimed is:

1. A multiple element laser diode assembly comprising:
   a laser diode for producing a laser beam, said beam defining a fast diverging axis and a slow diverging axis;
   a circularizing cylindrical microlens in operative combination with said laser diode for circularizing said diverging beam by changing the divergence of at least one of said fast diverging axis and said slow diverging axis; and
   an astigmatism correcting element for correcting the astigmatism of said beam after said beam has been circularized by said cylindrical microlens.

2. The multiple element laser diode assembly of claim 1 wherein said astigmatism correcting element is selected from the group consisting of tilted optical plate, cylindrical lens, tilted spherical lens, and tilted aspherical lens.

3. The multiple element laser diode assembly of claim 1 further comprising a collimating lens for collimating said beam after said beam has been circularized by said cylindrical microlens.

4. The multiple element laser diode assembly of claim 3 wherein said astigmatism correcting element is optically mounted between said cylindrical microlens and said collimating lens.

5. The multiple element laser diode assembly of claim 3 wherein said collimating lens is optically mounted between said cylindrical microlens and said astigmatism correcting element.

6. The multiple element laser diode assembly of claim 3 wherein said collimating lens is selected from the group consisting of spherical lens and aspherical lens.

7. The multiple element laser diode assembly of claim 1 wherein said laser diode further comprises a semiconductor laser diode.

8. A multiple element optical assembly comprising:
   a source producing a diverging beam of light, said beam defining a fast axis and a slow axis;
   a circularizing cylindrical microlens in operative combination with said source for circularizing said beam by changing the divergence of at least one of said fast axis and said slow axis; and
   at least one optical element in operative downstream combination with said cylindrical microlens, said at least one optical element selected from the group consisting of collimating lens, and astigmatism correcting element.

9. The multiple element laser diode assembly of claim 1 further comprising:

carrier means, implementing spacer means for mounting thereto said laser diode and said circularizing cylindrical microlens, whereby said laser diode and said circularizing cylindrical microlens are optically aligned and maintained in optical alignment.

10. The multiple element optical assembly of claim 8 further comprising: carrier means, implementing spacer means for mounting thereto said source and said circularizing cylindrical microlens, whereby said source and said circularizing cylindrical microlens are optically aligned and maintained in optical alignment.

11. The multiple element laser diode assembly of claim 1 further comprising a circularizing cylindrical microlens whose optical performance is characterized by being insensitive to position relative to the laser diode.

* * * * *